US010319836B1

United States Patent
Reznicek et al.

(10) Patent No.: US 10,319,836 B1
(45) Date of Patent: Jun. 11, 2019

(54) EFFECTIVE JUNCTION FORMATION IN VERTICAL TRANSISTOR STRUCTURES BY ENGINEERED BOTTOM SOURCE/DRAIN EPITAXY

(71) Applicant: International Business Machines Corporation, Armonk, NY (US)

(72) Inventors: Alexander Reznicek, Troy, NY (US); Shogo Mochizuki, Clifton Park, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/848,960

(22) Filed: Dec. 20, 2017

(51) Int. Cl.
*H01L 29/66* (2006.01)
*H01L 23/535* (2006.01)
*H01L 21/02* (2006.01)
*H01L 21/225* (2006.01)
*H01L 21/28* (2006.01)
*H01L 29/49* (2006.01)
*H01L 29/167* (2006.01)
*H01L 29/161* (2006.01)
(Continued)

(52) U.S. Cl.
CPC .... *H01L 29/66666* (2013.01); *H01L 21/0245* (2013.01); *H01L 21/02532* (2013.01); *H01L 21/02636* (2013.01); *H01L 21/2254* (2013.01); *H01L 21/28088* (2013.01); *H01L 21/76895* (2013.01); *H01L 23/535* (2013.01); *H01L 29/0847* (2013.01); *H01L 29/161* (2013.01); *H01L 29/167* (2013.01); *H01L 29/4966* (2013.01); *H01L 29/7827* (2013.01)

(58) Field of Classification Search
CPC .................. H01L 29/66666; H01L 21/823487
See application file for complete search history.

(56) References Cited

U.S. PATENT DOCUMENTS

| | | | | |
|---|---|---|---|---|
| 4,656,492 A | * | 4/1987 | Sunami | H01L 29/0847 257/336 |
| 5,126,278 A | * | 6/1992 | Kodaira | H01L 21/26506 438/350 |

(Continued)

OTHER PUBLICATIONS

Anonymous, "Method of Fabrication of Strained-SiGe Vertical Transistor", IPCOM000237153D, Jun. 5, 2014, 7 pages.

*Primary Examiner* — Farun Lu
(74) *Attorney, Agent, or Firm* — Scully, Scott, Murphy & Presser, P.C.; Daniel P. Morris, Esq.

(57) ABSTRACT

A vertical transistor structure is provided that includes a bottom source/drain structure that includes a doped semiconductor buffer layer that contains a first dopant species having a first diffusion rate, and an epitaxial doped semiconductor layer that contains a second dopant species that has a second diffusion rate that is less than the first diffusion rate. During a junction anneal, the first dopant species readily diffuses from the doped semiconductor buffer layer into a pillar portion of a base semiconductor substrate to provide the bottom source/drain extension and bottom source/drain junction. No diffusion overrun is observed. During the junction anneal, the second dopant species remains in the epitaxial doped semiconductor layer providing a low resistance contact. The second dopant species does not interfere with the bottom source/drain extension and bottom source/drain junction due to limited diffusion of the second dopant species.

9 Claims, 6 Drawing Sheets

(51) Int. Cl.
*H01L 29/08* (2006.01)
*H01L 29/78* (2006.01)
*H01L 21/768* (2006.01)

(56) References Cited

U.S. PATENT DOCUMENTS

| | | |
|---|---|---|
| 7,241,655 B2 | 7/2007 | Tang et al. |
| 9,647,123 B1 | 5/2017 | Balakrishnan et al. |
| 9,773,708 B1 | 9/2017 | Zhang et al. |
| 2009/0148991 A1* | 6/2009 | Chung .............. H01L 21/76237 438/268 |
| 2016/0293756 A1* | 10/2016 | Liu .................... H01L 29/7827 |
| 2017/0213900 A1 | 7/2017 | Cheng et al. |
| 2017/0243974 A1 | 8/2017 | Mallela et al. |
| 2017/0263781 A1 | 9/2017 | Anderson et al. |

* cited by examiner

EFFECTIVE JUNCTION FORMATION IN VERTICAL TRANSISTOR STRUCTURES BY ENGINEERED BOTTOM SOURCE/DRAIN EPITAXY

BACKGROUND

The present application relates to a semiconductor structure and a method of forming the same. More particularly, the present application relates to a vertical transistor having a bottom source/drain structure including a doped semiconductor buffer layer and an epitaxial doped semiconductor layer.

Conventional vertical transistors are devices where the source-drain current flows in a direction normal to the substrate surface. In such devices, a vertical semiconductor pillar (or fin) defines the channel with the source and drain located at opposing ends of the semiconductor pillar. Vertical transistors are an attractive option for technology scaling for 5 nm and beyond.

In conventional vertical transistor fabrication, the forming of the bottom source/drain and subsequent source/drain extension and source/drain junction are very challenging due to integration and thermal budget restrictions. There is thus a need for providing vertical transistors in which the formation of the bottom source/drain, the source/drain extension and the junction can be easily integrated into a vertical transistor processing flow, without negatively impacting any thermal budget restrictions.

SUMMARY

A vertical transistor structure is provided that includes a bottom source/drain structure that includes a doped semiconductor buffer layer that contains a first dopant species having a first diffusion rate, and an epitaxial doped semiconductor layer that contains a second dopant species that has a second diffusion rate that is less than the first diffusion rate. During a junction anneal, the first dopant species readily diffuses from the doped semiconductor buffer layer into a pillar portion of a base semiconductor substrate to provide the bottom source/drain extension and bottom source/drain junction. No diffusion overrun is observed. During the junction anneal, the second dopant species remains in the epitaxial doped semiconductor layer providing a low resistance contact. The second dopant species does not interfere with the bottom source/drain extension and bottom source/drain junction due to limited diffusion of the second dopant species.

One aspect of the present application relates to a semiconductor structure. In one embodiment, the semiconductor structure may include at least one semiconductor fin extending upwards from a pedestal portion of a base semiconductor substrate. A bottom source/drain structure is located on the base semiconductor substrate and is located laterally adjacent the pedestal portion. The bottom source/drain structure includes a doped semiconductor buffer layer that contains a first dopant species having a first diffusion rate, and an epitaxial doped semiconductor layer that contains a second dopant species that has a second diffusion rate that is less than the first diffusion rate. In accordance with the present application, the pedestal portion also includes the first dopant species. A gate structure is located above the bottom source/drain structure and on each side of the at least one semiconductor fin. A top source/drain structure is located on a topmost surface of the at least one semiconductor fin.

Another aspect of the present application relates to a method of forming a semiconductor structure. In one embodiment, the method may include forming at least one semiconductor fin extending upwards from a base semiconductor substrate, wherein the at least one semiconductor fin includes a hard mask cap located thereon. Next, a dielectric spacer is formed on sidewall surfaces of the at least one semiconductor fin and the hard mask cap. Physically exposed portions of the base semiconductor substrate are then removed to provide bottom source/drain trenches located laterally adjacent a pedestal portion of the base semiconductor substrate. Next, a bottom source/drain structure is formed at the bottom and sidewalls of each bottom source/drain trench. In accordance with the present application, bottom source/drain structure includes a doped semiconductor buffer layer containing a first dopant species having a first diffusion rate, and an epitaxial doped semiconductor layer containing a second dopant species having a second diffusion rate that is less than the first diffusion rate. First dopant species are then diffused from the doped semiconductor buffer layer into the pedestal portion of the base semiconductor substrate, and thereafter each dielectric spacer is removed. A gate structure is then formed above the epitaxial doped semiconductor material and the doped semiconductor buffer layer and on each side of the at least one semiconductor fin. Next, the hard mask cap is removed and a top source/drain structure is formed on a topmost surface of the at least one semiconductor fin.

DETAILED DESCRIPTION

Figure 1:
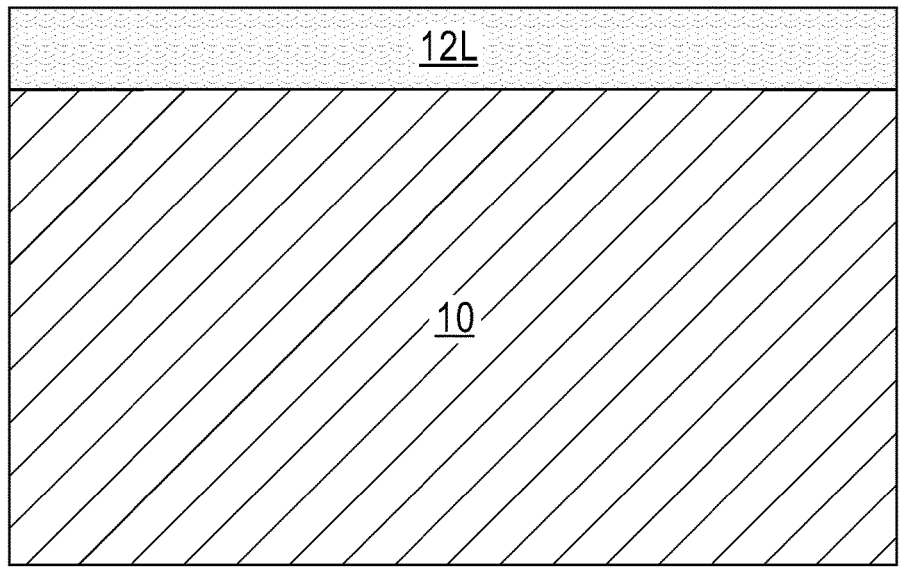
FIG. 1 is a cross sectional view of an exemplary semiconductor structure that can be employed in accordance with an embodiment of the present application and including a hard mask layer located on a surface of a semiconductor substrate.

The present application will now be described in greater detail by referring to the following discussion and drawings that accompany the present application. It is noted that the drawings of the present application are provided for illustrative purposes only and, as such, the drawings are not drawn to scale. It is also noted that like and corresponding elements are referred to by like reference numerals.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "beneath" or "under" another element, it can be directly beneath or under the other element, or intervening elements may be present. In contrast, when an element is referred to as being "directly beneath" or "directly under" another element, there are no intervening elements present.

Referring first to FIG. 1, there is illustrated an exemplary semiconductor structure that can be employed in accordance with an embodiment of the present application. The exemplary semiconductor structure of FIG. 1 includes a hard mask layer 12L located on a surface of a semiconductor substrate 10.

The semiconductor substrate 10 that can be employed in the present application is a bulk semiconductor substrate. By "bulk" it is meant that the semiconductor substrate 10 is entirely composed of at least one semiconductor material having semiconducting properties. Examples of semiconductor materials that may provide the semiconductor substrate 10 include silicon (Si), germanium (Ge), silicon germanium alloys (SiGe), silicon carbide (SiC), silicon germanium carbide (SiGeC), III-V compound semiconductors or II-VI compound semiconductors. III-V compound semiconductors are materials that include at least one element from Group III of the Periodic Table of Elements and at least one element from Group V of the Periodic Table of Elements. II-VI compound semiconductors are materials that include at least one element from Group II of the Periodic Table of Elements and at least one element from Group VI of the Periodic Table of Elements. In one example, the semiconductor substrate 10 may be entirely composed of silicon. In some embodiments, the semiconductor substrate 10 may include a multilayered semiconductor material stack including at least two different semiconductor materials, as defined above. In one example, the multilayered semiconductor material stack may comprise, in any order, a stack of Si and a silicon germanium alloy.

The semiconductor material that provides the semiconductor substrate 10 may be a single crystalline semiconductor material. The semiconductor material that provides the semiconductor substrate 10 may have any of the well known crystal orientations. For example, the crystal orientation of the semiconductor substrate 10 may be {100}, {110}, or {111}. Other crystallographic orientations besides those specifically mentioned can also be used in the present application.

The hard mask layer 12L that can be used in the present application includes any dielectric hard mask material such as, for example, silicon dioxide, silicon nitride and/or silicon oxynitride. In one example, silicon dioxide is employed as the dielectric hard mask material. The hard mask layer 12L may be formed utilizing a deposition process such as, for example, chemical vapor deposition (CVD) or plasma enhanced chemical vapor deposition (PECVD). In some embodiments, the hard mask layer 12L may be formed by a thermal growth process such as, for example, thermal oxidation and/or thermal nitridation. In yet other embodiments, the hard mask layer 12L may be formed utilizing a combination of, and in any order, a deposition process and a thermal growth process. The hard mask layer 12L is a continuous layer (without any breaks or gaps) whose thickness may be from 20 nm to 100 nm. Other thicknesses that are lesser than, or greater than the aforementioned thicknesses values may also be employed as the thickness of the hard mask layer 12L.

Figure 2:
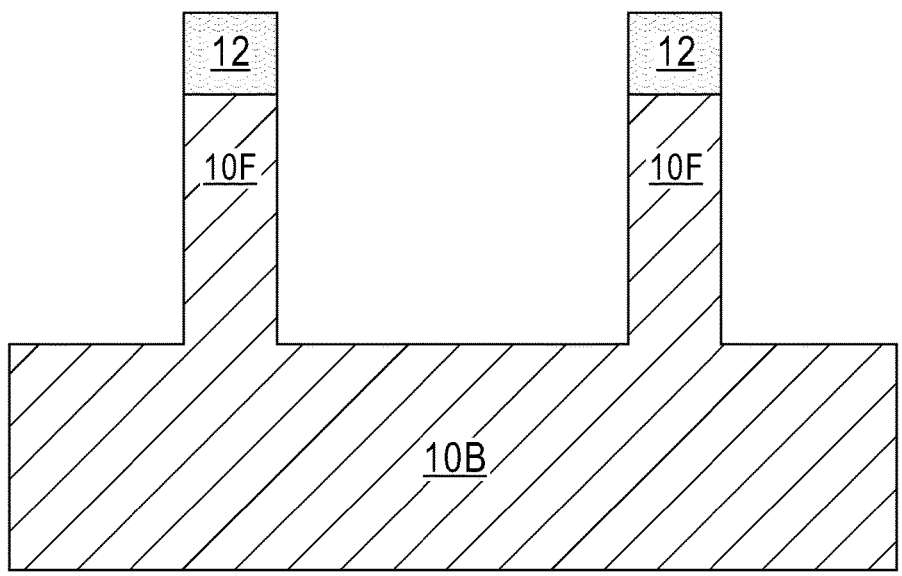
FIG. 2 is a cross sectional view of the exemplary semiconductor structure of FIG. 1 after patterning the hard mask layer and an upper semiconductor material portion of the semiconductor substrate to provide a plurality of hard mask capped semiconductor fins extending upwards from a surface of a remaining portion of the semiconductor substrate.

Referring now to FIG. 2, there is illustrated the exemplary semiconductor structure of FIG. 1 after patterning the hard mask layer 12L and an upper semiconductor material portion of the semiconductor substrate 10 to provide a plurality of hard mask capped semiconductor fins extending upwards from a surface of a remaining portion of the semiconductor substrate 10. Each hard mask cap 12 that is formed constitutes a remaining, non-etched portion of the hard mask layer 12L. Each semiconductor fin 10F constitutes a remaining, non-etched upper semiconductor portion of the semiconductor substrate 10 which is present directly beneath one of the hard mask caps 12. The remaining portion of the semiconductor substrate 10 that is located beneath each of the semiconductor fins 10F may be referred to herein as a base semiconductor substrate 10B.

In some embodiments, the semiconductor fins 10F and the base semiconductor substrate 10B may be composed of a same semiconductor material. In other embodiments, the semiconductor fins 10F and the base semiconductor substrate 10B may be composed of different semiconductor materials.

The number of hard mask capped semiconductor fins that are formed may vary and can be predetermined prior to forming the same. For example, it is possible to form a single hard mask capped semiconductor fin. As is shown, each semiconductor fin 10F contains a hard mask cap 12 whose sidewall surfaces are vertically aligned with the sidewall surfaces of one of the semiconductor fin 10F.

In one embodiment, the patterning of the hard mask layer 12L and the semiconductor substrate 10 may include lithography and etching. The lithographic process includes forming a photoresist (not shown) atop a material or material stack to be patterned, exposing the photoresist to a desired pattern of radiation, and developing the exposed photoresist utilizing a conventional resist developer. The photoresist may be a positive-tone photoresist, a negative-tone photoresist or a hybrid-tone photoresist. The etching process (i.e., patterned transfer etch) includes a dry etching process (such as, for example, reactive ion etching, ion beam etching, plasma etching or laser ablation), and/or a wet chemical etching process. In some embodiments, the patterned photoresist is removed from the structure immediately after the pattern has been transferred into the hard mask layer 12L. In other embodiments, the patterned photoresist is removed from the structure after the pattern has been transferred into both the hard mask layer 12L and the semiconductor substrate 10. In either embodiment, the patterned photoresist may be removed utilizing a conventional photoresist stripping process such as, for example, ashing.

In another embodiment, the patterning of the hard mask layer 12L and the semiconductor substrate 10 may include a sidewall image transfer (SIT) process. The SIT process includes forming a mandrel material layer (not shown) atop the material or material layers that are to be patterned. The mandrel material layer (not shown) can include any material (semiconductor, dielectric or conductive) that can be selectively removed from the structure during a subsequently performed etching process. In one embodiment, the mandrel material layer (not shown) may be composed of amorphous silicon or polysilicon. In another embodiment, the mandrel material layer (not shown) may be composed of a metal such as, for example, Al, W, or Cu. The mandrel material layer (not shown) can be formed, for example, by chemical vapor deposition or plasma enhanced chemical vapor deposition. Following deposition of the mandrel material layer (not shown), the mandrel material layer (not shown) can be patterned by lithography and etching to form a plurality of mandrel structures (also not shown) on the topmost surface of the structure.

The SIT process continues by forming a spacer (not shown) on each sidewall of each mandrel structure. The spacer can be formed by deposition of a spacer material and then etching the deposited spacer material. The spacer material may comprise any material having an etch selectivity that differs from the mandrel material. Examples of deposition processes that can be used in providing the spacer material include, for example, chemical vapor deposition (CVD), plasma enhanced chemical vapor deposition (PECVD), or atomic layer deposition (ALD). Examples of etching that be used in providing the spacers include any etching process such as, for example, reactive ion etching.

After formation of the spacers, the SIT process continues by removing each mandrel structure. Each mandrel structure can be removed by an etching process that is selective for removing the mandrel material. Following the mandrel structure removal, the SIT process continues by transferring the pattern provided by the spacers into the underlying material or material layers. The pattern transfer may be achieved by utilizing at least one etching process. Examples of etching processes that can used to transfer the pattern may include dry etching (i.e., reactive ion etching, plasma etching, and ion beam etching or laser ablation) and/or a chemical wet etch process. In one example, the etch process used to transfer the pattern may include one or more reactive ion etching steps. Upon completion of the pattern transfer, the SIT process concludes by removing the spacers from the structure. Each spacer may be removed by etching or a planarization process.

In yet a further embodiment, the patterning of the hard mask layer 12L and the semiconductor substrate 10 may include a direct self-assembly (DSA) process in which a copolymer that is capable of direct self-assembly is used.

As used herein, a "semiconductor fin" refers to a semiconductor material that includes a pair of vertical sidewalls that are parallel to each other. As used herein, a surface is "vertical" if there exists a vertical plane from which the surface does not deviate by more than three times the root mean square roughness of the surface. In one embodiment, each semiconductor fin 10F has a height from 20 nm to 200 nm, and a width from 5 nm to 30 nm. Other heights and/or widths that are lesser than, or greater than, the ranges mentioned herein can also be used in the present application. Each semiconductor fin 10F is spaced apart from its nearest neighboring semiconductor fin 10F by a pitch of from 20 nm to 100 nm; the pitch is measured from one point of one semiconductor fin to the exact point on a neighboring semiconductor fin. Also, each semiconductor fin 10F is oriented parallel to each other. An opening or gap is present between each neighboring pairs of semiconductor fins 10F.

Figure 3:
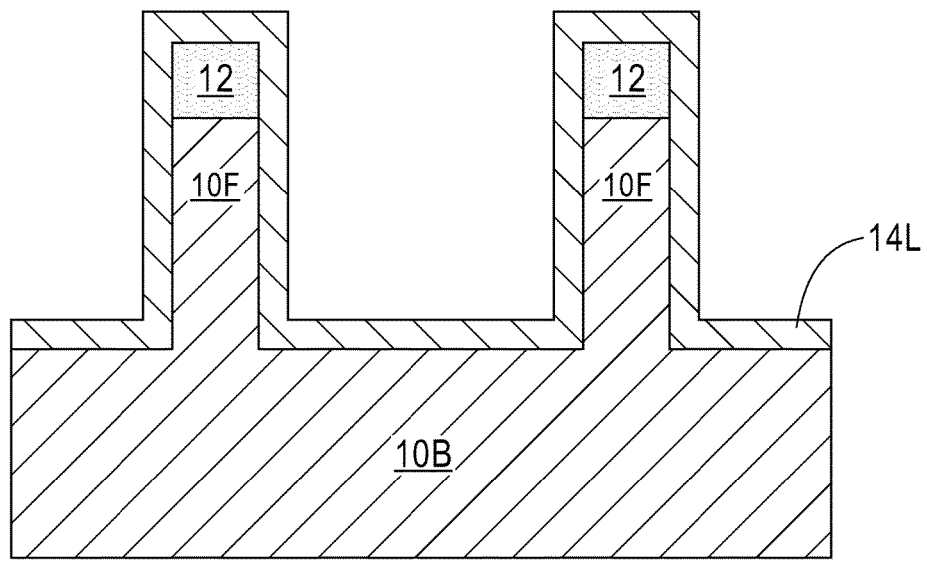
FIG. 3 is a cross sectional view of the exemplary semiconductor structure of FIG. 2 after forming a dielectric spacer material layer.

Referring now to FIG. 3, there is illustrated the exemplary semiconductor structure of FIG. 2 after forming a dielectric spacer material layer 14L. Dielectric spacer material layer 14L is a continuous layer that is formed on physically exposed surfaces of each hard mask cap 12, each semiconductor fin 12 and the base semiconductor substrate 10B.

The dielectric spacer material layer 14L may be composed of any dielectric spacer material including for example, silicon dioxide, silicon nitride or silicon oxynitride, with the proviso that the dielectric spacer material differs in composition from the hard mask material that provides each hard mask cap 12. In one example, the hard mask caps 12 are composed of silicon dioxide, while the dielectric spacer material layer 12L is composed of silicon nitride. The dielectric spacer material layer 14L may be formed utilizing a deposition process such as, for example, chemical vapor deposition or plasma enhanced chemical vapor deposition. The dielectric spacer material layer 14L may have a thickness from 4 nm to 10 nm. Other thicknesses that are lesser than, or greater than, the aforementioned thickness range may also be employed in the present application as the thickness of the dielectric spacer material layer 14L.

Figure 4:
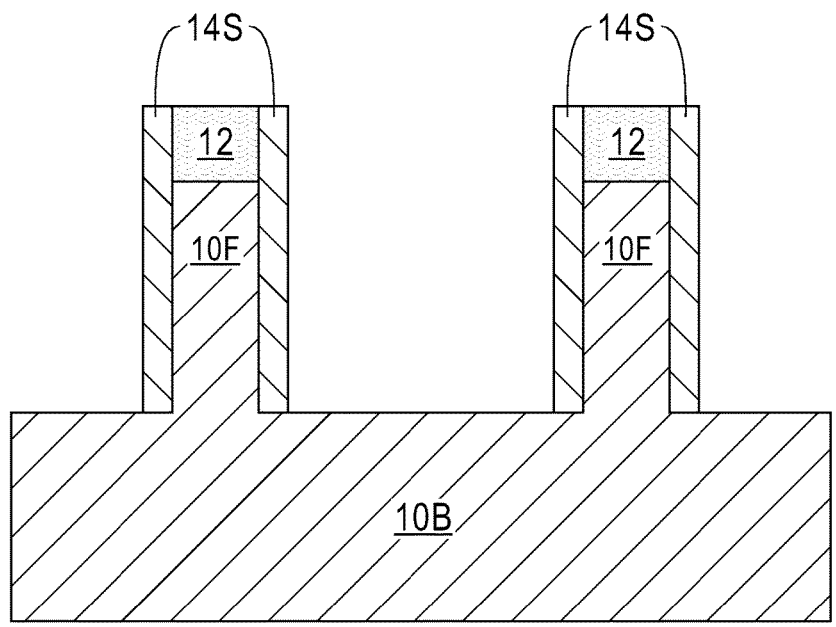
FIG. 4 is a cross sectional view of the exemplary semiconductor structure of FIG. 3 after etching the dielectric spacer material layer to provide a dielectric spacer on sidewall surfaces of each semiconductor fin and each hard mask cap.

Referring now to FIG. 4, there is illustrated the exemplary semiconductor structure of FIG. 3 after etching the dielectric spacer material layer 14L to provide a dielectric spacer 14S on sidewall surfaces of each semiconductor fin 10F and each hard mask cap 14. The etching of the dielectric spacer material layer 14L that provides dielectric spacer 14S may include a spacer etch process as is known to those skilled in the art. Each dielectric spacer 24S that is formed has a topmost surface that is coplanar with a topmost surface of each hard mask cap 12, and a bottommost surface that is coplanar with a bottommost surface of each semiconductor fin 10F.

Figure 5:
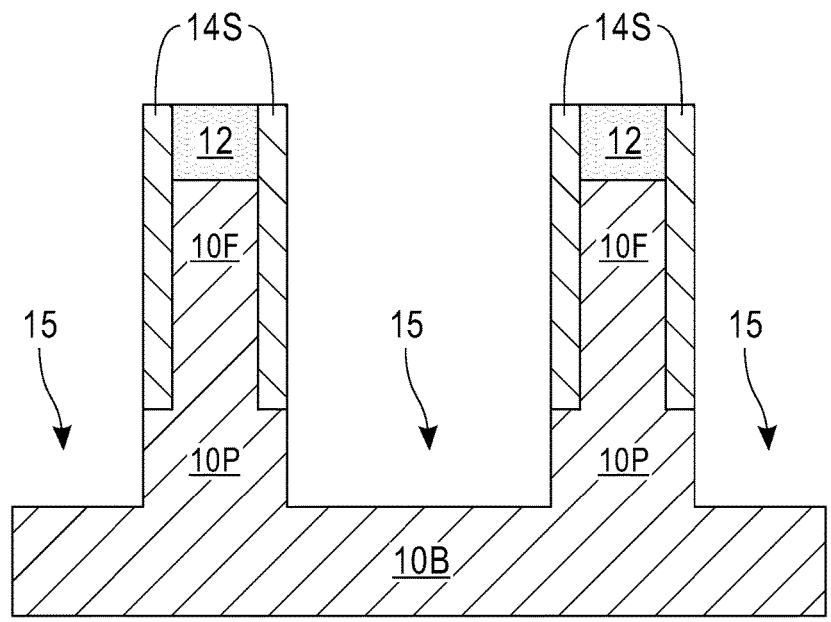
FIG. 5 is a cross sectional view of the exemplary semiconductor structure of FIG. 4 after recessing physically exposed portions of remaining portion of the semiconductor substrate to provide bottom source/drain trenches.

Referring now to FIG. 5, there is illustrated the exemplary semiconductor structure of FIG. 4 after recessing physically exposed portions of remaining portion of the semiconductor substrate, i.e., base semiconductor substrate 10B, to provide bottom source/drain trenches 15. The bottom source/drain trenches 15 are positioned laterally adjacent a pedestal portion 10P of the base semiconductor substrate 10B. The pedestal portion 10P that is formed has a width that is greater than a width of the overlying semiconductor fin 10F.

The recessing of the base semiconductor substrate 10B may be performed utilizing an etching process that is selective in removing the semiconductor material that provides the base semiconductor substrate 10B. In one embodiment, and when the base semiconductor substrate 10B is composed of silicon, a wet etch including potassium hydroxide (KOH) or tetramethylammonium hydroxide (TMAH) may be used. Each bottom source/drain trench 15 that is formed may have a depth from 20 nm to 150 nm beneath the original non-recessed surface of the base semiconductor substrate 10B.

Figure 6:
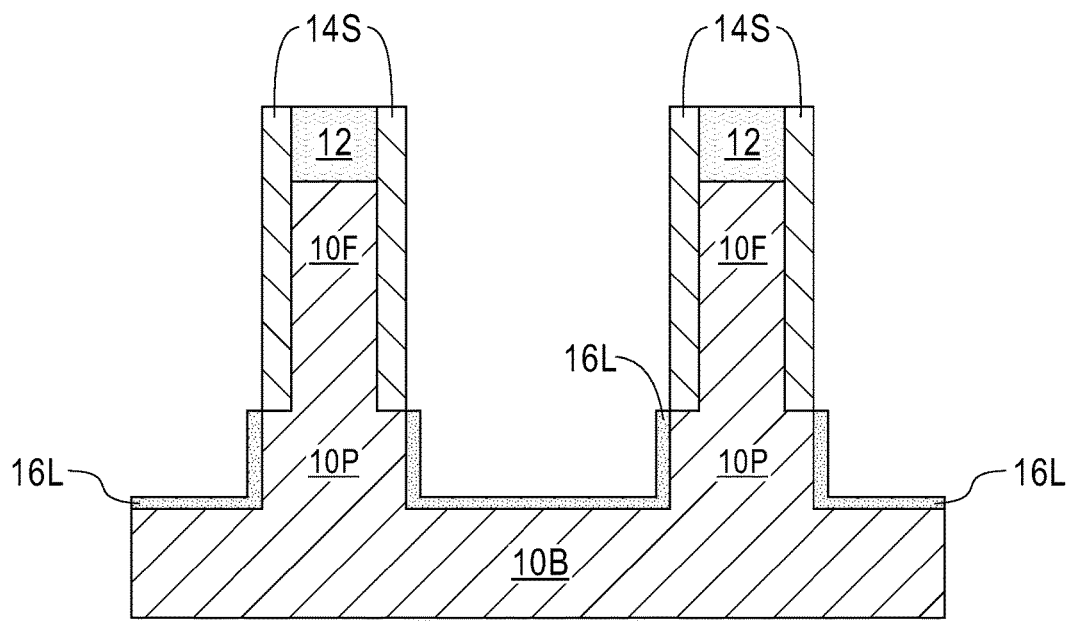
FIG. 6 is a cross sectional view of the exemplary semiconductor structure of FIG. 5 after forming a doped semiconductor buffer layer at the bottom and sidewalls of each bottom source/drain trench.

Referring now to FIG. 6, there is illustrated the exemplary semiconductor structure of FIG. 5 after forming a doped semiconductor buffer layer 16L at the bottom and sidewalls of each bottom source/drain trench 15. Notably, the doped semiconductor buffer layer 16L is formed on sidewall surfaces of each pedestal portion 10P of the base semiconductor substrate 10B as well as physically exposed surfaces of the recessed base semiconductor substrate 10B.

The doped semiconductor buffer layer 16L comprises a first semiconductor material that contains a first dopant species. The first semiconductor material may include one of the semiconductor materials mentioned above for the semiconductor substrate 10. In one embodiment, the first semiconductor material may be composed of a same semiconductor material as the semiconductor substrate 10. In one example, the first semiconductor material that provides the doped semiconductor layer 16L and the semiconductor substrate 10 are both composed of silicon. In another embodiment, the first semiconductor material may be composed of a different semiconductor material than the semiconductor substrate 10. In one example, the first semiconductor material that provides the doped semiconductor layer 16L is composed of a silicon germanium alloy (in some embodiments, the silicon germanium alloy may include 20 atomic percent to 80 atomic percent germanium), while the semiconductor substrate 10 is composed of silicon.

The first dopant species has a first diffusion rate that is greater than the second diffusion rate of the second dopant species within the subsequently formed epitaxial doped semiconductor layer 18. That is, the first dopant species is easily diffusible as compared with the second dopant species. The first dopant species also has a size that is smaller than a size of the second dopant species within the subsequently formed epitaxial doped semiconductor layer 18. The first dopant species may be either a p-type dopant or an n-type dopant provided that the dopant type meets the above mentioned criteria for the first dopant species. The term "p-type" refers to the addition of impurities to an intrinsic semiconductor that creates deficiencies of valence electrons. In a silicon-containing semiconductor material, examples of p-type dopants, i.e., impurities, include, but are not limited to, boron, aluminum, gallium and indium. The concentration of first dopant species within the doped semiconductor buffer layer 16L can be from $1\times10^{19}$ atoms/cm$^3$ to $1\times10^{20}$ atoms/cm$^3$.

In one embodiment of the present application and in cases in which a pFET is to be formed, the doped semiconductor buffer layer 16L can be composed of boron doped silicon or a boron doped silicon germanium alloy. In another embodiment of the present application and in cases in which an nFET is to be formed, the doped semiconductor buffer layer 16L can be composed of phosphorus doped silicon or a phosphorus doped silicon germanium alloy.

The doped semiconductor buffer layer 16L can be formed by a selective epitaxial growth or deposition process. The term "selective epitaxial growth or deposition" denotes a process in which a semiconductor material is grown only from a semiconductor surface; no semiconductor material growth occurs on dielectric surfaces. Here, the doped semiconductor buffer layer 16L is grown only from the exposed surfaces of the recessed semiconductor base substrate 10B and the pedestal portion 10P.

The terms "epitaxially growing and/or depositing" and "epitaxially grown and/or deposited" mean the growth of a semiconductor material on a deposition surface of a semiconductor material, in which the semiconductor material being grown has the same crystalline characteristics as the semiconductor material of the deposition surface. In an epitaxial growth process, the chemical reactants provided by the source gases are controlled and the system parameters are set so that the depositing atoms arrive at the deposition surface of the semiconductor substrate with sufficient energy to move around on the surface and orient themselves to the crystal arrangement of the atoms of the deposition surface. Therefore, an epitaxial semiconductor material has the same crystalline characteristics as the deposition surface on which it is formed. In the present application, the doped semiconductor buffer layer 16L has an epitaxial relationship with the physically exposed surface of the recessed base semiconductor substrate 10B and the sidewalls of each pedestal portion 10P.

Examples of various epitaxial growth process apparatuses that can be employed in the present application include, e.g., rapid thermal chemical vapor deposition (RTCVD), low-energy plasma deposition (LEPD), ultra-high vacuum chemical vapor deposition (UHVCVD), atmospheric pressure chemical vapor deposition (APCVD) and molecular beam epitaxy (MBE). The epitaxial growth may be performed at a temperature of from 300° C. to 800° C. The epitaxial growth can be performed utilizing any well known precursor gas or gas mixture. Carrier gases like hydrogen, nitrogen, helium and argon can be used. A dopant (n-type or p-type, as defined above) is added to the precursor gas or gas mixture.

The doped semiconductor buffer layer 16L that is formed has a thickness from 1 nm to 10 nm. In some embodiments, thicknesses greater than 20 nm are not employed so as to limit the amount of the first dopant species that is present during a subsequently performed junction anneal.

Figure 7:
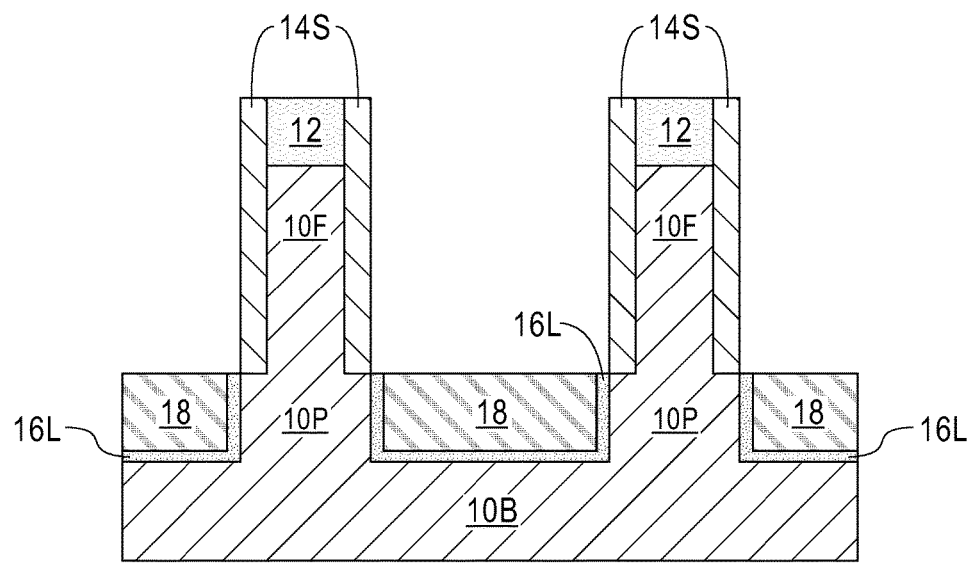
FIG. 7 is a cross sectional view of the exemplary semiconductor structure of FIG. 6 after forming an epitaxial doped semiconductor layer on the doped semiconductor buffer layer and within each bottom source/drain trench.

Referring now to FIG. 7, there is illustrated the exemplary semiconductor structure of FIG. 6 after forming an epitaxial doped semiconductor layer 18 on the doped semiconductor buffer layer 16L and within each bottom source/drain trench 15. The epitaxial doped semiconductor layer 18 has a topmost surface that is typically coplanar with a topmost surface of the doped semiconductor buffer layer 16L that is present along the sidewall surfaces of each of the pedestal portions 10P.

The epitaxial doped semiconductor layer 18 comprises a second semiconductor material that contains a second dopant species. The second semiconductor material may include one of the semiconductor materials mentioned above for the semiconductor substrate 10 and the first semiconductor material. The second semiconductor material may be composed of a same semiconductor material as the first semiconductor material that provides the doped semiconductor buffer layer 16L. In one example, the first and second semiconductor materials are both composed of a silicon germanium alloy (in some embodiments, the silicon germanium alloy may include 20 atomic percent to 80 atomic percent germanium). In some embodiments, the second semiconductor material may be composed of a different semiconductor material than the first semiconductor material that provides the doped semiconductor buffer layer 16L. In one example, the first semiconductor material is composed of silicon, while the second semiconductor material is composed of a silicon germanium alloy or unalloyed germanium.

The second dopant species is of a same conductivity type as the first dopant species. That is, both the first and second dopant species are n-type dopants or p-type dopants. The second dopant species has a second diffusion rate that is less than the first diffusion rate of the first dopant species within the previously formed doped semiconductor buffer layer 16L. That is, the second dopant species is less diffusible as compared with the first dopant species. The second dopant species also has a size that is greater than the size of the first dopant species within the previously formed doped semiconductor buffer layer 16L. The concentration of second dopant species within the epitaxial doped semiconductor layer 18 can be from $2 \times 10^{20}$ atoms/cm$^3$ to $5 \times 10^{21}$ atoms/cm$^3$.

In one embodiment of the present application and in cases in which a pFET is to be formed, the doped semiconductor buffer layer 16L can be composed of boron doped silicon or a boron doped silicon germanium alloy, and the epitaxial doped semiconductor layer 18 may be composed of gallium doped silicon, indium doped silicon, gallium doped silicon germanium or indium doped silicon germanium. In another embodiment of the present application and in cases in which an nFET is to be formed, the doped semiconductor buffer layer 16L can be composed of phosphorus doped silicon or a phosphorus doped silicon germanium alloy and the epitaxial doped semiconductor layer 18 may be composed of antimony doped silicon or antimony doped silicon germanium.

The epitaxial doped semiconductor layer 18 can be formed by a selective epitaxial growth or deposition process, as defined above. The epitaxial doped semiconductor layer 18 has an epitaxial relationship with the underlying doped semiconductor buffer layer 16L.

The epitaxial growth of the epitaxial doped semiconductor layer 18 can be performed utilizing one of the apparatuses mentioned above for forming the doped semiconductor buffer layer 16L. The epitaxial growth of the epitaxial doped semiconductor layer 18 can be performed at a temperature of from 300° C. to 800° C. The epitaxial growth can be performed utilizing any well known precursor gas or gas mixture. Carrier gases like hydrogen, nitrogen, helium and argon can be used. A dopant (n-type or p-type, as defined above) is added to the precursor gas or gas mixture.

In one embodiment, the epitaxial doped semiconductor layer 18 is formed from a digermane precursor source using tri-tert-butylgallium or trimethylindium as dopant sources without carbon incorporation. In some embodiments, and for unalloyed germanium, a small amount of silicon (less than 1%) can be added during the epitaxial growth to enhance the incorporation of Ga or In into the unalloyed germanium layer. In other embodiments, a small amount of boron can be used in addition to silicon to obtain the same effect.

Collectively, the doped semiconductor buffer layer 16L and the epitaxial doped semiconductor layer 18 provide components a bottom source/drain structure of the exemplary structure of present application.

Figure 8:
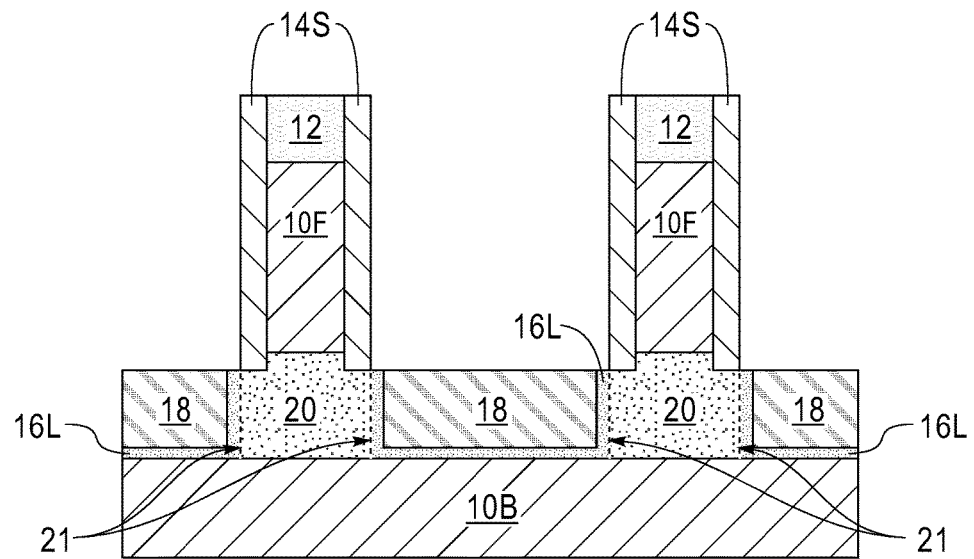
FIG. 8 is a cross sectional view of the exemplary semiconductor structure of FIG. 7 after performing an anneal in which first dopant species from the doped semiconductor buffer layer diffuses into a pedestal portion of the remaining portion of the semiconductor substrate.

Referring now to FIG. 8, there is illustrated the exemplary semiconductor structure of FIG. 7 after performing an anneal in which the first dopant species from the doped semiconductor buffer layer 16L diffuses into the pedestal portion 10P of the base semiconductor substrate 10B providing a bottom source/drain extension region 20. The dotted lines represent a bottom source/drain junction region 21. Since only a limited amount of the first dopant species diffuses, no diffusion overrun is observed. Also, and during this anneal, the second dopant species remains in the epitaxial doped semiconductor layer 18 providing a low resistance contact. The second dopant species does not interfere with the bottom source/drain extension 20 and bottom source/drain junction 21 due to limited diffusion of the second dopant species.

The anneal may also be referred to herein as a junction anneal. The anneal can be performed at a temperature from 900° C. to 1200° C., and an inert ambient (i.e., helium, argon, neon and/or nitrogen). The anneal can be a furnace anneal, a laser anneal, or a spike anneal.

Figure 9:
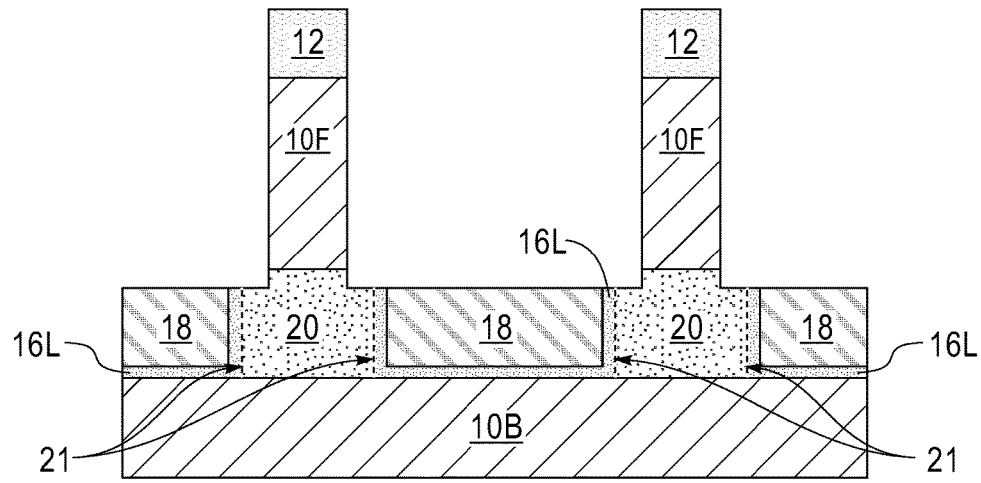
FIG. 9 is a cross sectional view of the exemplary semiconductor structure of FIG. 8 after removing each dielectric spacer.

Referring now to FIG. 9, there is illustrated the exemplary semiconductor structure of FIG. 8 after removing each dielectric spacer 14S. Each dielectric spacer 14S may be removed utilizing an etching process that is selective in removing the dielectric spacer material that provides each dielectric spacer. In one example, and when the dielectric spacers 14S are composed of silicon nitride, hot phosphoric acid may be used to remove each of the dielectric spacers 14S from the sidewall surfaces of each semiconductor fin 10F.

Figure 10:
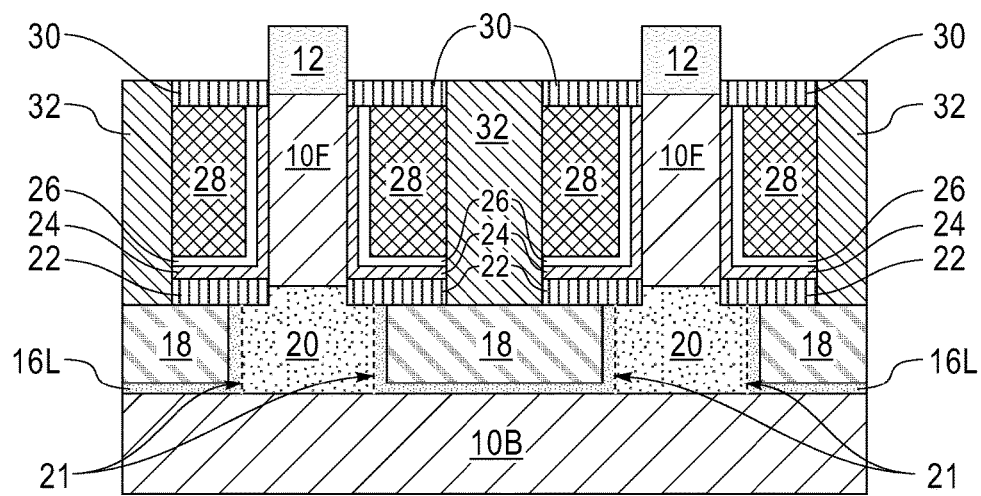
FIG. 10 is a cross sectional view of the exemplary semiconductor structure of FIG. 9 after forming a bottom spacer, a gate structure and a top spacer.

Referring now to FIG. 10, there is illustrated the exemplary semiconductor structure of FIG. 9 after forming a bottom spacer 22, a gate structure (24, 26, 28) and a top spacer 30.

The bottom spacer 22 contacts sidewall surfaces of the lower portion of the semiconductor fins 10F. The bottom spacer 22 may be composed of any dielectric spacer material including for example, silicon dioxide, silicon nitride or silicon oxynitride. The bottom spacer 22 may be formed utilizing a deposition process such as, for example, chemical vapor deposition or plasma enhanced chemical vapor deposition. In some instances, an etch back process may follow the deposition of the dielectric spacer material that provides the bottom spacer 22. The bottom spacer 22 may have a thickness from 4 nm to 10 nm. Other thicknesses that are lesser than, or greater than, the aforementioned thickness range may also be employed in the present application as the thickness of the bottom spacer 22 as long as the height of the bottom spacer 22 is not greater than the height of the semiconductor fins 10F and there is sufficient area on each the semiconductor fins 10F to form other components of a vertical FET.

A gate structure is then formed. The gate structure may include a gate dielectric material layer 24, a work function metal layer 26 and a gate conductor 28. In some embodiments, the work function metal layer 26 may be omitted. As is shown, the gate dielectric material layer 24 is formed along the exposed sidewall surfaces of each semiconductor fin 10F. If present, the work function metal layer 26 is formed on the exposed surfaces of the gate dielectric material layer 24. The gate conductor 28 is formed either on the exposed surfaces of the work function metal layer 26 or the exposed surfaces of the gate dielectric material layer 24 if the work function metal layer 26 is absent.

The gate dielectric material layer 24 may be composed of a gate dielectric material such as, for example, an oxide, nitride, and/or oxynitride. In one example, the gate dielectric material layer 24 can be a high-k material having a dielectric constant greater than silicon dioxide. Exemplary high-k dielectrics include, but are not limited to, $HfO_2$, $ZrO_2$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, SiON, $SiN_x$, a silicate thereof, and an alloy thereof. Each value of x is independently from 0.5 to 3 and each value of y is independently from 0 to 2. In some embodiments, a multilayered gate dielectric structure comprising different gate dielectric materials, e.g., silicon dioxide, and a high-k gate dielectric, can be formed and used as gate dielectric material layer 24. The gate dielectric material that provides the gate dielectric material layer 24 can be formed by any deposition process including, for example, chemical vapor deposition (CVD), plasma enhanced chemical vapor deposition (PECVD), physical vapor deposition (PVD), sputtering, or atomic layer deposition (ALD). In one embodiment of the present application, the gate dielectric material that provides the gate dielectric material layer 24 can have a thickness in a range from 1 nm to 10 nm. Other thicknesses that are lesser than, or greater than, the aforementioned thickness range can also be employed for the gate dielectric material that provides the gate dielectric material layer 24.

The work function metal layer 26 may be composed of a p-type work function metal or an n-type work function metal. In the case of a p-type device, the work functional metal layer 26 should effectuate a p-type threshold voltage shift, i.e., a p-type work function metal is employed. In one embodiment, the work function of the p-type work function metal ranges from 4.9 eV to 5.2 eV. As used herein, "threshold voltage" is the lowest attainable gate voltage that will turn on a semiconductor device, e.g., transistor, by making the channel of the device conductive. The term "p-type threshold voltage shift" as used herein means a shift in the Fermi energy of a p-type semiconductor device towards a valence band of silicon in the silicon containing material of the p-type semiconductor device. A "valence band" is the highest range of electron energies where electrons are normally present at absolute zero.

In one embodiment, the p-type work function metal may be composed of titanium and its nitride or carbide. In one specific embodiment, the p-type work function metal is composed of titanium nitride. The p-type work function metal may also be composed of titanium aluminum nitride, ruthenium, platinum, molybdenum, cobalt, and alloys and combinations thereof.

In an n-type device, the work function metal layer 26 should effectuate an n-type threshold voltage shift; i.e., a n-type work function is used. "N-type threshold voltage shift" as used herein means a shift in the Fermi energy of an n-type semiconductor device towards a conduction band of silicon in a silicon-containing material of the n-type semiconductor device. The "conduction band" is the lowest lying electron energy band of the doped material that is not completely filled with electrons. In one embodiment, the work function of the n-type work function metal ranges from 4.1 eV to 4.3 eV. In one embodiment, the n-type work function metal is composed of at least one of titanium aluminum, tantalum nitride, titanium nitride, hafnium nitride, hafnium silicon, or combinations thereof.

The work function metal layer 26 may be formed utilizing a deposition process such as, for example, chemical vapor deposition (CVD), plasma enhanced chemical vapor deposition (PECVD), physical vapor deposition (PVD), sputtering, or atomic layer deposition (ALD). In one embodiment of the present application, the work function metal that provides the work function metal layer 26 can have a thickness in a range from 1 nm to 10 nm. Other thicknesses that are lesser than, or greater than, the aforementioned thickness range can also be employed for the work function metal that provides the work function metal layer 26.

The gate conductor 28 may be composed of a gate conductor material. The gate conductor material used in providing the gate conductor 28 can include any conductive material including, for example, doped polysilicon, an elemental metal (e.g., tungsten, titanium, tantalum, aluminum, nickel, ruthenium, palladium and platinum), an alloy of at least two elemental metals, an elemental metal nitride (e.g., tungsten nitride, aluminum nitride, and titanium nitride), an elemental metal silicide (e.g., tungsten silicide, nickel silicide, and titanium silicide) or multilayered combinations thereof.

The gate conductor material used in providing the gate conductor 28 can be formed utilizing a deposition process including, for example, chemical vapor deposition (CVD), plasma enhanced chemical vapor deposition (PECVD), physical vapor deposition (PVD), sputtering, atomic layer deposition (ALD) or other like deposition processes. When a metal silicide is formed, a conventional silicidation process is employed. In one embodiment, the gate conductor material used in providing the gate conductor 28 can have a thickness from 50 nm to 200 nm. Other thicknesses that are lesser than, or greater than, the aforementioned thickness range can also be employed for the gate conductor material used in providing the gate conductor 28.

In some embodiments of the present application, a vertical nFET transistor can be formed in an nFET device region (say, for example, the region including the semiconductor fin 10F on the left hand side of the drawings) and a vertical transistor can be formed in a pFET device region (say, for example, the region including the semiconductor fin 10F on the right hand side of the drawings). In such an embodiment, block mask technology may be used.

Top spacer 30 may include one of the materials mentioned above for bottom spacer 22; top spacer 30 is composed of a different dielectric material than the hard mask caps 12. Top spacer 30 may be formed utilizing one of the deposition processes mentioned above in forming the bottom spacer 22. Top spacer 30 may have a thickness within the thickness range mentioned above for the bottom spacer 22.

Next, a middle-of-the line dielectric (MOL) dielectric material 32 is formed laterally surrounding each gate structure and each semiconductor fin. The MOL dielectric material 32 is formed by first patterning the gate structure and bottom spacer 22 by lithography and etching to provide a cavity. The cavity is then filled with the MOL dielectric material 32. The MOL dielectric material 32 has a topmost surface that is coplanar with a topmost surface of the top spacer 22.

The MOL dielectric material 32 may be composed of silicon dioxide, undoped silicate glass (USG), fluorosilicate glass (FSG), borophosphosilicate glass (BPSG), a spin-on low-k dielectric layer, a chemical vapor deposition (CVD) low-k dielectric layer or any combination thereof. The term "low-k" as used throughout the present application denotes a dielectric material that has a dielectric constant of less than silicon dioxide. In another embodiment, a self-planarizing material such as a spin-on glass (SOG) or a spin-on low-k dielectric material such as SiLK™ can be used as MOL dielectric material 32. In one embodiment, the MOL dielectric material 32 can be formed utilizing a deposition process including, for example, chemical vapor deposition (CVD), plasma enhanced chemical vapor deposition (PECVD), evaporation or spin-on coating. Following deposition of the ILD material 28, a planarization process such as chemical mechanical polishing can employed.

Figure 11:
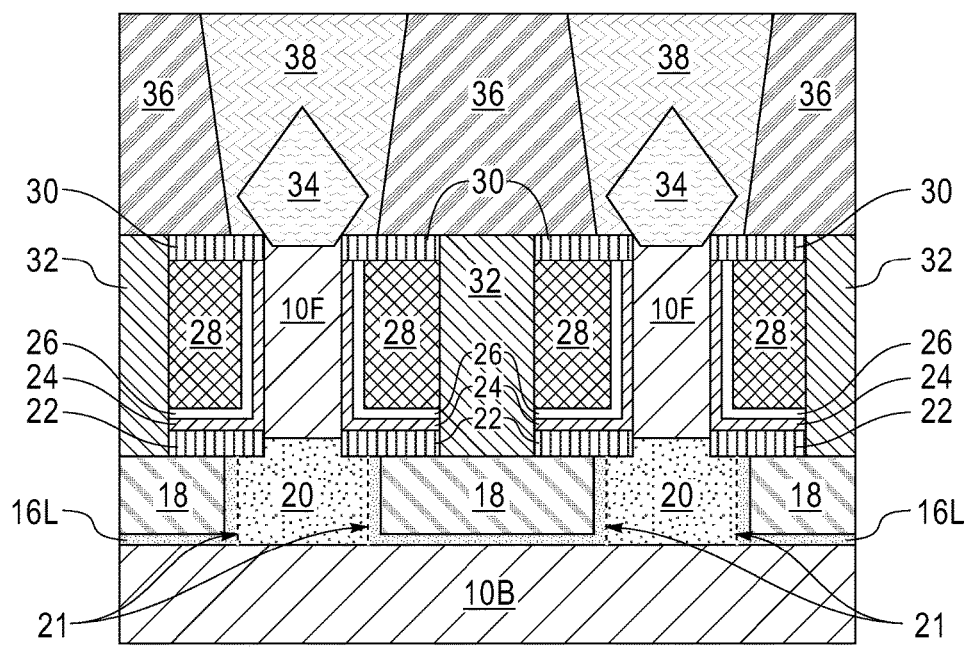
FIG. 11 is a cross sectional view of the exemplary semiconductor structure of FIG. 10 after removing each hard mask cap, forming a top source/drain structure and forming contact structures.

Referring now to FIG. 11, there is illustrated the exemplary semiconductor structure of FIG. 10 after removing each hard mask cap 12, forming a top source/drain structure 34 and forming contact structures 38. Each hard mask cap 12 can be removed utilizing a material removal process such as, for example, etching or planarization. The removal of each hard mask cap 12 exposed a topmost surface of each semiconductor fin 10F.

Next, a top source/drain structure 34 can be formed utilizing an epitaxial growth (or deposition) process, as defined above. In accordance with the present application, the top source/drain structure 34 includes a semiconductor material and either an n-type or p-type dopant. The conductivity of the dopant present in the top source/drain structure is the same as the conductivity of the first and second dopant species mentioned above. The semiconductor material that provides the top source/drain structure 34 may be the same or different from the semiconductor material of semiconductor substrate 10. The concentration of dopant within the semiconductor material that provides the top source/drain structure 34 can range from $1\times10^{18}$ atoms/cm$^3$ to $1\times10^{21}$ atoms/cm$^3$, although dopant concentrations greater than $1\times10^{21}$ atoms/cm$^3$ or less than $1\times10^{18}$ atoms/cm$^3$ are also conceived. The doped source/drain structure 34 may have a faceted surface. In one example, the top source/drain structure 34 may be diamond shaped.

Next, a contact dielectric material 36 is formed. The contact dielectric material 36 may include one of the dielectric materials mentioned above for the MOL dielectric material 32. Contact dielectric material 36 may include a same, or different dielectric material, than the MOL dielectric material 32. The contact dielectric material 36 may be formed by one of the deposition processes mentioned above in forming the MOL dielectric material 32. A planarization process may follow the deposition of the dielectric material that provides the contact dielectric material 36.

Contact openings (not specifically shown) are then formed into the contact dielectric material 36 to physically exposed surfaces of the top source/drain structures 34. A contact metal such as, for example, copper, aluminum, tungsten, cobalt, or alloys thereof is the formed into each contact opening utilizing a deposition process. A planarization process may follow the deposition process. The contact metal or metal alloy within each contact opening is referred to herein as a contact structure 38. As shown in FIG. 13, the contact structures 38 have a topmost surface that is coplanar with a topmost surface of the contact dielectric material 36.

Notably, FIG. 11 shows an exemplary vertical transistor structure of the present application. The exemplary structure includes at least one semiconductor fin 10F extending upwards from a pedestal portion (i.e., extension region 20) of a base semiconductor substrate 10B. A bottom source/drain structure is located on the base semiconductor substrate 10B and is located laterally adjacent the pedestal portion (i.e., extension region 20). The bottom source/drain structure includes a doped semiconductor buffer layer 16L that contains a first dopant species having a first diffusion rate, and an epitaxial doped semiconductor layer 18 that contains a second dopant species that has a second diffusion rate that is less than the first diffusion rate. In accordance with the present application, the pedestal portion (i.e., extension region 20) also includes the first dopant species. A gate structure (24, 26, 28) is located above the bottom source/drain structure (16L, 20) and on each side of the at least one semiconductor fin 10. A top source/drain structure 34 is located on a topmost surface of the at least one semiconductor fin 10.

While the present application has been particularly shown and described with respect to preferred embodiments thereof, it will be understood by those skilled in the art that the foregoing and other changes in forms and details may be made without departing from the spirit and scope of the present application. It is therefore intended that the present application not be limited to the exact forms and details described and illustrated, but fall within the scope of the appended claims.

What is claimed is:

1. A semiconductor structure comprising:
    at least one semiconductor fin extending upwards from a pedestal portion of a base semiconductor substrate;
    a bottom source/drain structure located on the base semiconductor substrate and located adjacent the pedestal portion, wherein the bottom source/drain structure includes a doped semiconductor buffer layer that contains a first dopant species having a first diffusion rate, and an epitaxial doped semiconductor layer that contains a second dopant species that has a second diffusion rate that is less than the first diffusion rate, and wherein the pedestal portion contains the first dopant species, and wherein the doped semiconductor buffer layer has a topmost surface that is coplanar with a topmost surface of the epitaxial doped semiconductor layer;
    a gate structure located above the bottom source/drain structure and on each side of the at least one semiconductor fin; and
    a top source/drain structure located on a topmost surface of the at least one semiconductor fin.

2. The semiconductor structure of claim 1, wherein the pedestal portion has a width that is greater than a width of the at least one semiconductor fin.

3. The semiconductor structure of claim 1, wherein the gate structure comprises a gate dielectric material layer and a gate conductor, wherein the gate dielectric material layer directly contacts sidewall surfaces of the at least one semiconductor fin.

4. The semiconductor structure of claim 3, wherein the gate structure further comprises a work function metal layer located between the gate dielectric material layer and the gate conductor.

5. The semiconductor structure of claim 1, further comprising a bottom spacer located between the gate structure and the bottom source/drain structure, wherein the bottom spacer contacts a lower portion of the least one semiconductor fin.

6. The semiconductor structure of claim 5, further comprising a top spacer located on a topmost surface of the gate structure and contacting an upper portion of the least one semiconductor fin.

7. The semiconductor structure of claim 1, wherein the first dopant species has a size that is smaller than a size of the second dopant species.

8. The semiconductor structure of claim 7, wherein the doped semiconductor buffer layer comprises boron doped silicon or boron doped silicon germanium.

9. The semiconductor structure of claim 8, wherein the epitaxial doped semiconductor layer comprises gallium doped germanium, gallium doped silicon germanium, indium doped germanium or indium doped silicon germanium.

* * * * *